United States Patent
Chen et al.

(10) Patent No.: US 8,587,321 B2
(45) Date of Patent: Nov. 19, 2013

(54) SYSTEM AND METHOD FOR CURRENT-BASED PLASMA EXCURSION DETECTION

(75) Inventors: Jian J. Chen, Fremont, CA (US); Mohamad A. Ayoub, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 336 days.

(21) Appl. No.: 12/890,089

(22) Filed: Sep. 24, 2010

(65) Prior Publication Data

US 2012/0074951 A1    Mar. 29, 2012

(51) Int. Cl.
G01R 31/14    (2006.01)
(52) U.S. Cl.
USPC ........................................................ 324/509
(58) Field of Classification Search
USPC ........................ 324/509, 536, 464
See application file for complete search history.

(56) References Cited

U.S. PATENT DOCUMENTS

| | | | |
|---|---|---|---|
| 4,356,443 A * | 10/1982 | Emery | 324/546 |
| 5,472,561 A * | 12/1995 | Williams et al. | 438/10 |
| 5,855,681 A | 1/1999 | Maydan et al. | |
| RE38,273 E * | 10/2003 | Gerrish et al. | 315/111.21 |
| 6,878,636 B2 | 4/2005 | Bailey et al. | |
| 7,305,311 B2 * | 12/2007 | van Zyl | 702/57 |
| 7,514,936 B2 * | 4/2009 | Anwar et al. | 324/536 |
| 7,628,863 B2 | 12/2009 | Sen et al. | |
| 7,640,120 B2 | 12/2009 | Axenbeck et al. | |
| 7,696,758 B2 * | 4/2010 | Chung et al. | 324/464 |
| 7,728,602 B2 * | 6/2010 | Valcore et al. | 324/536 |
| 7,737,706 B2 * | 6/2010 | Yamazawa | 324/707 |
| 7,745,328 B2 | 6/2010 | Yim et al. | |
| 7,761,247 B2 | 7/2010 | van Zyl | |
| 7,767,053 B2 | 8/2010 | Takeda et al. | |
| 7,768,269 B2 | 8/2010 | Pipitone et al. | |
| 8,110,992 B2 * | 2/2012 | Nitschke | 315/111.21 |

(Continued)

FOREIGN PATENT DOCUMENTS

| | | |
|---|---|---|
| JP | 2003-234332 A | 8/2003 |
| JP | 2006-507662 A | 3/2006 |

(Continued)

OTHER PUBLICATIONS

International Search Report and Written Opinion dated Apr. 10, 2012 for International Application No. PCT/US2011/049108.

*Primary Examiner* — Jermele M Hollington
*Assistant Examiner* — Demetrius Pretlow
(74) *Attorney, Agent, or Firm* — Patterson & Sheridan, LLP

(57) ABSTRACT

A system and method for the detection of plasma excursions, such as arcs, micro-arcs, or other plasma instability, during plasma processing by directly monitoring RF current just prior to reaching an RF power electrode of a plasma processing chamber is provided. The monitored RF current may be converted to an RF voltage and then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In one embodiment, the RF current amplified and converted to a digital signal for digital filtering and processing. In certain embodiments, multiple processing regions can be monitored by a single detection control unit.

21 Claims, 8 Drawing Sheets

(56) References Cited

U.S. PATENT DOCUMENTS

| | | | |
|---|---|---|---|
| 2003/0205460 A1* | 11/2003 | Buda | 204/192.13 |
| 2004/0031699 A1* | 2/2004 | Shoji | 205/791.5 |
| 2004/0045506 A1* | 3/2004 | Chen et al. | 118/723 I |
| 2004/0150386 A1* | 8/2004 | Gonzalez et al. | 324/117 R |
| 2004/0182697 A1* | 9/2004 | Buda | 204/298.08 |
| 2005/0236266 A1* | 10/2005 | Poole et al. | 204/192.13 |
| 2005/0264962 A1* | 12/2005 | Kim et al. | 361/42 |
| 2006/0081564 A1* | 4/2006 | Moroz et al. | 219/121.43 |
| 2006/0213761 A1* | 9/2006 | Axenbeck et al. | 204/192.1 |
| 2006/0262466 A1* | 11/2006 | Engel | 361/42 |
| 2007/0073498 A1 | 3/2007 | Winterhalter et al. | |
| 2008/0021664 A1 | 1/2008 | Krauss et al. | |
| 2008/0061793 A1* | 3/2008 | Anwar et al. | 324/464 |
| 2008/0087381 A1* | 4/2008 | Shannon et al. | 156/345.44 |
| 2009/0044748 A1* | 2/2009 | Pipitone et al. | 118/697 |
| 2009/0044750 A1* | 2/2009 | Pipitone | 118/712 |
| 2009/0045046 A1* | 2/2009 | Pipitone et al. | 204/192.13 |
| 2009/0053836 A1* | 2/2009 | Pipitone et al. | 438/10 |
| 2009/0151871 A1* | 6/2009 | Pease et al. | 156/345.28 |
| 2009/0159439 A1* | 6/2009 | Pipitone et al. | 204/298.03 |
| 2010/0012482 A1* | 1/2010 | Klein et al. | 204/192.13 |

FOREIGN PATENT DOCUMENTS

| | | |
|---|---|---|
| KR | 10-2008-0107824 | 12/2008 |
| KR | 10-2009-0042576 | 4/2009 |
| KR | 10-2009-0108711 | 10/2009 |
| WO | WO 2008-150136 | 12/2008 |

* cited by examiner

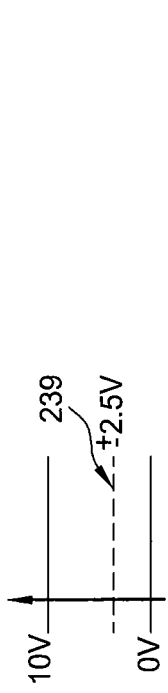
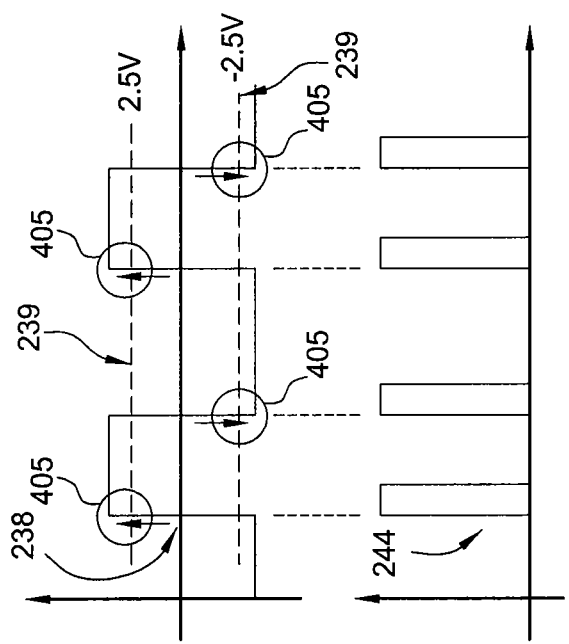
FIG. 4A  FIG. 4B  FIG. 4C

SYSTEM AND METHOD FOR CURRENT-BASED PLASMA EXCURSION DETECTION

BACKGROUND OF THE INVENTION

1. Field of the Invention

Embodiments of the present invention generally relate to a system and method for the detection of plasma excursions, such as arcs, micro-arcs, or other plasma instability, during plasma processing.

2. Description of the Related Art

During plasma processing of substrates, such as plasma etch, plasma enhanced chemical vapor deposition (PECVD), or physical vapor deposition (PVD), plasma excursions, such as arcs, micro-arcs, or other plasma instability, occurs sporadically and unpredictably. In addition, the requirements of certain processes substantially increase the probability of electrical breakdown and plasma excursions. Such plasma excursions result in shifted process results, reduced product yield, and increased system downtime. Thus, detection of plasma excursions during plasma processing of substrates is desired to better define and control process conditions having fewer plasma excursions.

Prior art attempts at detecting plasma excursions, such as arcing, involves measuring the radio frequency (RF) waveform generated at or near an RF power supply far from the processing chamber or between the RF power supply and an RF matching network positioned between the RF power supply and the plasma load of a processing chamber. The RF waveform is typically measured in analog form and digitized, followed by digital signal processing. It has been found that such prior art methods have an overall sampling rate in the millisecond range, which is too slow to detect and resolve arcs or micro-arcs that occur within a few microseconds. It has also been found that prior art plasma excursion detection methods are susceptible to delay and distortion, resulting in poor recognition of a substantial amount of plasma instabilities. Therefore, improved plasma excursion detection apparatus and methods are needed to overcome the shortcoming of the prior art.

SUMMARY OF THE INVENTION

In one embodiment, a method for detecting plasma excursions in a plasma chamber comprises directly sensing a radio frequency (RF) current from an RF transmission line at a position between an RF matching network and an RF powered electrode within the plasma chamber during plasma processing, converting the RF current to a voltage signal, filtering the voltage signal using a plurality of filters to obtain an output voltage signal, comparing the output voltage signal to a preset voltage value that represents a plasma excursion event, and generating an alarm signal if the output voltage signal exceeds the preset voltage value.

In another embodiment, a system for detecting plasma excursions in a plasma chamber comprises one or more current probes and a plasma excursion detection unit comprising one or more excursion detection modules. Each current probe is positioned to sense an RF current from a transmission line at a position between an RF matching network and an RF electrode within a plasma chamber during plasma processing, and each current probe is further configured to convert the RF current to a voltage signal. Each excursion detection module is configured to receive the voltage signal from one of the one or more current probes. Each excursion detection module comprises a plurality of filters arranged to filter the voltage signal to obtain an output voltage signal. Each excursion module further comprises a comparator configured to compare the output voltage signal to a preset voltage signal and generate an alarm signal if the output voltage signal exceeds the preset voltage signal. The plasma excursion detection unit further comprises one or more connection ports configured to receive the preset voltage signal from a host controller and configured to send the alarm signal to the host controller, and a data acquisition module configured to collect and transfer the output voltage signal from each of the one or more excursion detection modules to a data logging and diagnostic system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4C are graphical depictions of the function of the comparator of the circuit of FIG. 2.

DETAILED DESCRIPTION

The present invention provides a system and method for the detection of plasma excursions, such as arcs, micro-arcs, or other plasma instability, during plasma processing by directly monitoring RF current just prior to reaching an RF power electrode of a plasma processing chamber. The monitored RF current may be converted to an RF voltage and then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In one embodiment, the RF current amplified and converted to a digital signal for digital filtering and processing. In certain embodiments, multiple processing regions can be monitored by a single detection control unit.

Figure 1:
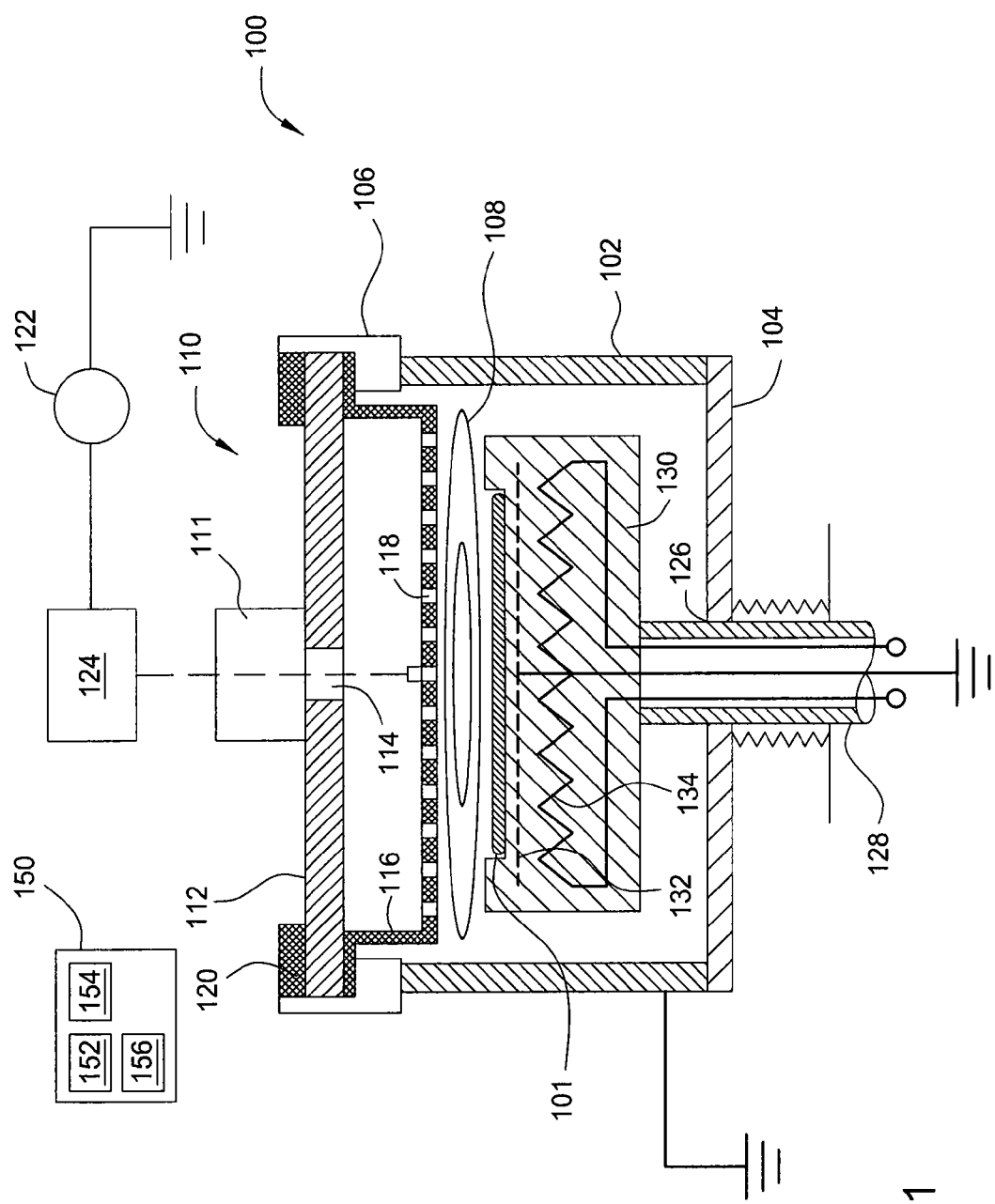
FIG. 1 is a schematic, cross-sectional view of a PECVD chamber on which the present invention may be used.

FIG. 1 is a schematic, cross-sectional view of a PECVD chamber 100 on which the present invention may be used. The PECVD chamber 100 includes sidewalls 102, a bottom wall 104, and a chamber lid 106, which cumulatively define a processing region 108. A gas distribution system 110 is disposed through the chamber lid 106 to deliver gases into the processing region 108. The gas distribution system 110 includes a gas box 112 with a gas inlet 114 that receives processing gases from a precursor source 111 and that introduces processing gases into the gas box 112 and a showerhead 116 having a plurality of gas passages 118 for distributing the processing gases from the gas box 112 into the processing region 108. The gas distribution system 110 may also include a gas box heater 120, such as a ring-shaped, resistive heater, to heat processing gases to a desired temperature.

The showerhead 116 is coupled to an RF power supply 122 to provide electrical energy to the showerhead 116 to facilitate plasma formation in the processing region 108. Thus, the showerhead 116 acts as an upper, powered electrode. An auto-tuned RF matching network 124 is positioned between the RF power supply 122 and the showerhead 116. In one embodiment, the RF power is supplied at a frequency of about 13.56 MHz.

The bottom wall 104 defines a passage 126 for a stem 128 that supports a pedestal heater 130. The pedestal heater 130 is configured to support a substrate 101 in the processing region 108. The pedestal heater 130 includes a ground mesh 132 embedded therein, which is connected to an RF ground. Thus, the ground mesh 132 acts as a ground electrode to facilitate plasma formation in the processing region 108 between the showerhead 116 and the pedestal heater 130. The pedestal heater 130 also includes one or more heating elements 134, such as resistive heating elements, to heat the substrate 101 to a desired processing temperature.

A control system 150 including a central processing unit (CPU) 152, a memory 154, and support circuits 156, is coupled to the various components of the chamber 100 to facilitate control of processing within the chamber 100. The memory 154 can be any computer-readable medium, such as random access memory (RAM), read only memory (ROM), floppy disk, hard disk, or any other form of digital storage, local or remote to the chamber 100 or CPU 152. The support circuits 156 are coupled to the CPU 152 for supporting the CPU 152 in a conventional manner. These circuits include cache, power supplies, clock circuits, input/output circuitry and subsystem, and the like. A software routine or a series of program instructions store in the memory 154, when executed by the CPU 152, causes the chamber 100 to perform plasma processes therein.

Deposition chambers that may benefit from the present invention include chambers configured to deposit oxides, such as carbon-doped silicon oxides, silicon containing films, and other dielectric materials including advanced patterned films (APF). An example of a deposition chamber is the PRODUCERS chamber available from Applied Materials, Inc. of Santa Clara, Calif. The PRODUCER® chamber is a PECVD chamber with two isolated processing regions that may be used to deposit carbon-doped silicon oxides and other materials. Further details of an exemplary chamber useful for the present invention is described in U.S. Pat. No. 5,855,681, which is incorporated by reference herein. Although the chamber 100 is schematically depicted as a PECVD chamber, use of the invention may be equally affective on other chambers, such as plasma etch or PVD chambers.

Figure 2:
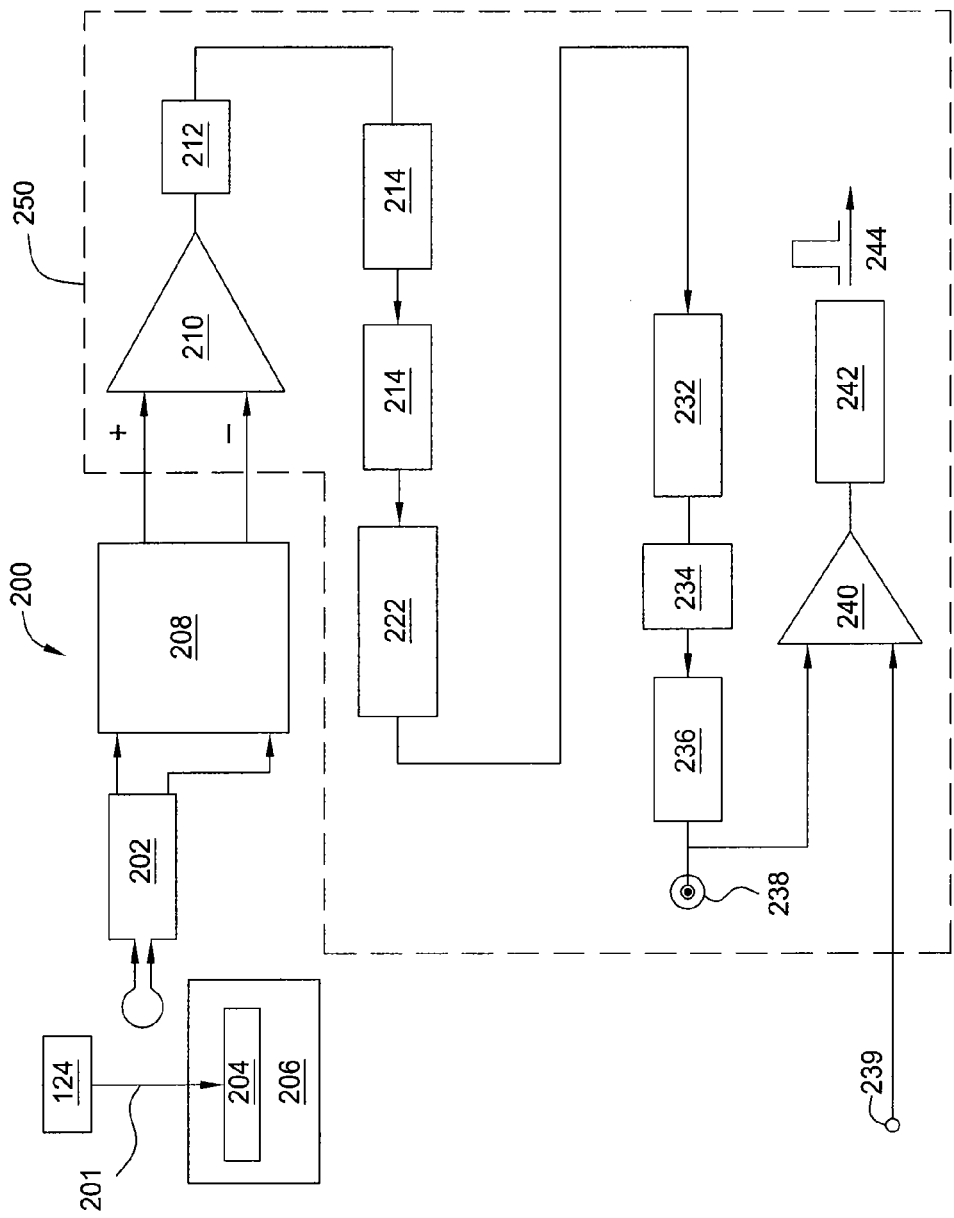
FIG. 2 is a schematic, block diagram of current-based plasma excursion detection circuit according to one embodiment of the invention.

FIG. 2 is a schematic, block diagram of a current-based plasma excursion detection circuit 200 according to one embodiment of the invention. The detection circuit 200 includes an RF current probe 202 that is coupled to an RF power transmission line 201 between the RF matching network 124 and an upper, powered electrode 204 within a plasma chamber 206, such as the showerhead 116 in the PECVD chamber 100 depicted in FIG. 1. Preferably, the RF current probe is coupled to the RF power transmission line 201 just prior to connection of the RF power transmission line 201 to the powered electrode 204. Directly detecting the RF current near the powered electrode 204 allows much more sensitive plasma excursion detection as opposed to detection at or near the RF power generator or the RF matching network (FIG. 1), which is the convention in the art, as previously discussed.

The RF current probe 202 may be a single loop current transformer or a multiple loop current transformer. The RF current flowing through the RF power transmission line 201 produces a time-varying magnetic field around the RF power transmission line 201. The time-varying magnetic field, in turn, produces a time-varying electric field at an RF frequency. The time-varying electric field induces RF current flowing through the loop(s) and a resistor in the current probe 202. The result is a conversion of the RF current to an RF voltage for subsequent processing.

Next, the RF voltage is filtered by dual RF filters 208 (e.g., block frequencies exceeding about 70 kHz). The resulting voltage signal is then amplified by a differential amplifier 210, such as an instrumentation amplifier. In the differential amplifier 210, the common-mode noise (e.g., RF induced noise) that may be present on the positive and negative terminals of the differential amplifier 210 is rejected. A fast buffer 212 is positioned after the differential amplifier 210 to provide both isolation and signal relay buffering for the next stage of signal processing in the circuit 200.

In one embodiment, the voltage signal from the fast buffer 212 is optionally passed through one or more notch filters 214. In one embodiment, the notch filter 214 is a 60 Hz notch filter. In one embodiment, the notch filter 214 is a 50 Hz notch filter. Alternatively, the notch filter 214 may include both a 60 Hz notch filter and a 50 Hz notch filter. Because the powered electrode 202 acts like a large receiving antenna, it directly picks up unwanted 60 Hz (North America) or 50 Hz (Europe/Japan) noise from heaters present in the chamber 204, such as the gas box heater 120 or the pedestal heater 130 depicted in the chamber 100 of FIG. 1. This unwanted noise may be passed to the voltage signal and removed by the notch filter(s) 214. The filtered voltage signal may then be transferred to a fast buffer 222, which provides isolation and signal buffering for the subsequent signal processing.

In certain embodiments, it is believed that because the RF current to the powered electrode 204 is sensed (i.e., the input to the plasma), negligible noise from the plasma load and the heaters present in the chamber 206. In such a case, the notch filter(s) 214 may not be needed.

In one embodiment, the voltage signal then passes through an analog band pass filter 232 having a pass band specifically designed to detect fast plasma excursion events, such as on a time scale of between about 10 μs and about 1 ms. For instance, the pass band of the band pass filter 232 may have a low cutoff at about 250 Hz and a high cutoff at about 50 kHz. The voltage signal then passes through a high pass filter 234 and an amplifier 236 to provide an excursion output signal 238. The high pass filter 234 provides further AC coupling and removes any DC offset prior to amplification in the amplifier 236. Thus, the excursion output signal 238 provides a signal with additional filtering such that any spikes in the DC bias are clearly detectable without distortion from AC noise within the chamber 206. Therefore, the excursion output signal 238 can be used to detect any excursion, or plasma instability, within the chamber 206, such as arcs or micro-arcs.

In one embodiment, the excursion output signal 238 is fed into a comparator 240, where the value of the excursion output signal 238 is compared with a preset value 239, such as that supplied by a user or programmed into the control system 150 (FIG. 1). If the excursion output signal 238 exceeds the preset value 239 within a very short time period (e.g., 1 ms), the comparator 240 passes a signal to an analog to digital converter 242 to generate a digital alarm signal 244 to flag the spike or plasma excursion. The alarm signal 244 can be fed back into the system controller 150, where an operator can be alerted and/or the processing system can be shut down.

Figure 3:
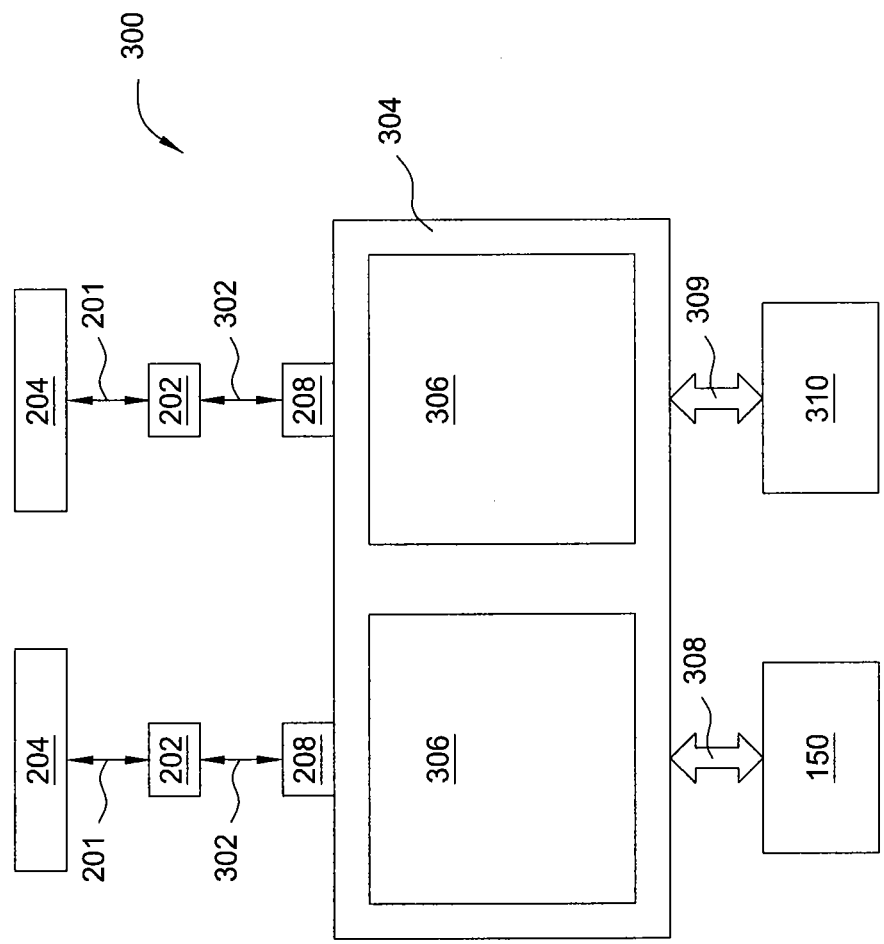
FIG. 3 is a schematic, block diagram of one embodiment of a plasma excursion detection system according to one embodiment.

FIG. 3 is a schematic, block diagram of one embodiment of a plasma excursion detection system 300 using the detection circuit 200 described above. The excursion detection system 300, depicted in FIG. 3, is for use with embodiments where dual processing regions are to be monitored, such as with the PRODUCER® chamber described above. However, single processing region applications are equally applicable.

In processing applications having multiple processing regions to be monitored, the RF power transmission line 201 coupled the powered electrode 204 within each processing region 206 is separately monitored by a single RF current probe 202. Each RF current probe 202 is connected to the dual RF filters 208 via cables 302. The voltage signal from each of the RF filters 208 are separately fed into a detection control unit 304 which includes a separate detection module 306 for each processing region 206 to be monitored. The detection modules 306 each contain all of the components of the circuit 200 encircled by the boxes 250, 550, 650, 750, and 850 in FIGS. 2, 5, 6, 7, and 8, respectively. The detection control unit 304 includes a connection 308 to the system controller 150 for reception of the preset value(s) 239 and output of the digital alarm signal 244 between each of the detection modules 306 and the system controller 150. In addition, the detection control unit 304 includes a data acquisition unit and a port 309, such as a USB port, that can be connected to a personal computer 310 having data logging and diagnostic software thereon. In one embodiment, the computer 310 continually logs the excursion output signal 238 through the data acquisition port 309. In another embodiment, the computer 310 only logs the excursion output signal 238 from one of the detection modules 306 through the data acquisition port 309 for diagnostics when the excursion output signal 238 exceeds the preset value 239 and the alarm signal 244 is generated from the corresponding detection module 306. This functionality allows automatic logging and diagnostics to be performed on the magnitude and duration of any plasma excursions generated during plasma processing.

FIGS. 4A-4C are graphical depictions of the function of the comparator 240 of the circuit 200 of FIG. 2. FIG. 4A is a graphical depiction of the preset value 239 or user programmed trigger level on a scale between 0 V and 10 V. In this example, a preset value of 2.5 V is specified. This preset value is entered in a process recipe and interpreted by the detection control unit 304 as a band limit of ±2.5 V, even if a single positive 2.5 V is entered in the system. FIG. 4B is a graphical depiction of the excursion output signal 238 with the preset value 239 overlaid. As denoted at points 405, the excursion output signal 238 exceeds the band limit defined by the preset value 239 at a number of locations (i.e., greater than 2.5 V or less than −2.5 V). FIG. 4C is a graphical depiction of the alarm signal 244 corresponding to the points 405 where the excursion output signal 238 exceeds the band limit defined by the preset value 239.

Figure 5:
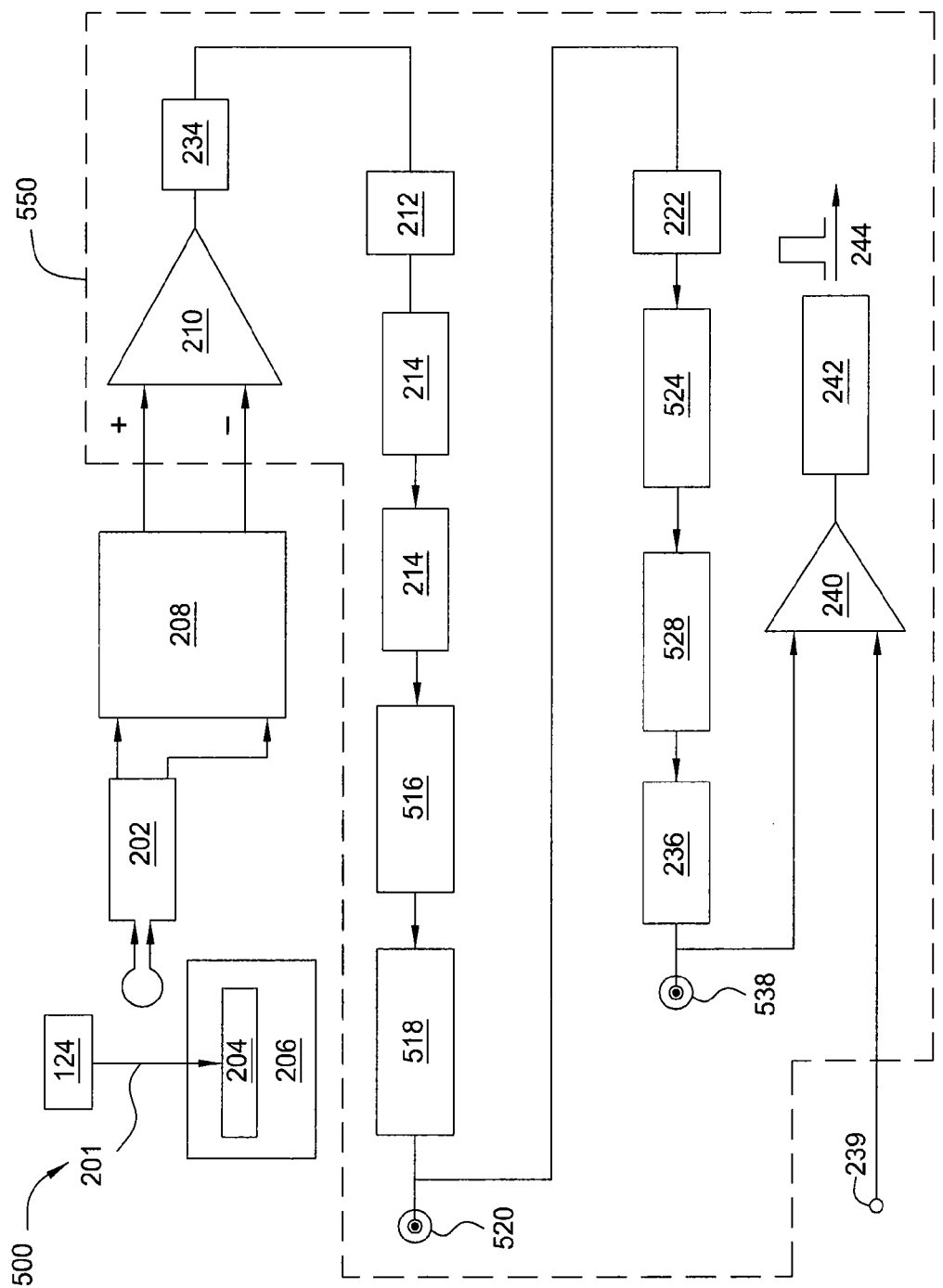
FIG. 5 is a schematic, block diagram of a current-based plasma excursion detection circuit according to another embodiment.

FIG. 5 is a schematic, block diagram of a current-based plasma excursion detection circuit 500 according to another embodiment. Many aspects of the excursion detection circuit 500 and subsequent circuits 600, 700, and 800, are the same or similar to those of the excursion detection circuit 200. Thus, identical item numbers are used when referring to identical components between the circuits.

The detection circuit 500 includes the RF current probe 202 that is coupled to the RF power transmission line 201 just prior to connection of the RF power transmission line 201 to the powered electrode 204. The RF current probe 202 converts the detected RF current to an RF voltage. The RF voltage is then filtered by the dual RF filters 208. The resulting voltage signal is then amplified by the differential amplifier 210 to remove the common-mode noise that may be present on the positive and negative terminals of the differential amplifier 210.

The resulting voltage signal passes through a high pass filter 234, which removes any DC offset or drift in the voltage signal. Eliminating the DC component in the voltage signal at this point has been found to substantially increase the dynamic range for subsequently processing the AC component. The fast buffer 212 is positioned after the high pass filter 234 to provide both signal isolation and signal relay buffering for the next stage of signal processing. Next, the voltage signal from the fast buffer 212 may be passed through one or more optional notch filters 214 as described with respect to FIG. 2.

The voltage signal is then passed through a low pass filter 516, such as a fourth order low pass filter (e.g., blocks frequencies exceeding about 55 kHz) and an amplifier 518 to provide a filtered voltage output signal 520. The filtered voltage output signal 520 may provide an intermediate diagnostic signal for visualization of the original voltage signal.

The filtered voltage output signal 520 is transferred to the fast buffer 222, which provides isolation and signal buffering for subsequent signal processing. The filtered voltage signal 520 is then passed through a high pass filter 524, such as a fourth order high pass band filter (e.g., blocks frequencies below about 230 Hz). The combination of the low pass filter 516 and the high pass filter 524 provides steeper attention in the stop band and sharper transitions around both the low cutoff frequency (e.g., 230 Hz) and the high cutoff frequency (e.g., 55 kHz) than the band pass filter 232 used in the excursion detection circuit 200.

The voltage signal may then be passed from the high pass filter 524 through one or more notch filters 528 to provide additional filtering of noise in the RF current signal from the RF transmission line 201. For instance, turning the gas box heater 120 on and off during processing may contribute noise to the signal at a number of different frequencies. Once the specific frequencies are determined, one or more notch filters 528 can be selected to remove those specific frequencies. The filtered signal is then amplified in the amplifier 236 to provide an excursion output signal 538. The excursion output signal 538 is then fed into the comparator 240, wherein the value of the excursion output 538 is compared with the preset value 239. If the excursion output signal 238 exceeds the preset value within a specified time period, the comparator 240 passes a signal to the analog to digital converter 242 to generate the digital alarm signal 244 to flag the spike or plasma excursion. The alarm signal 244 can be fed back into the system controller 150, where an operator can be alerted and/or the processing system can be shut down.

Figure 6:
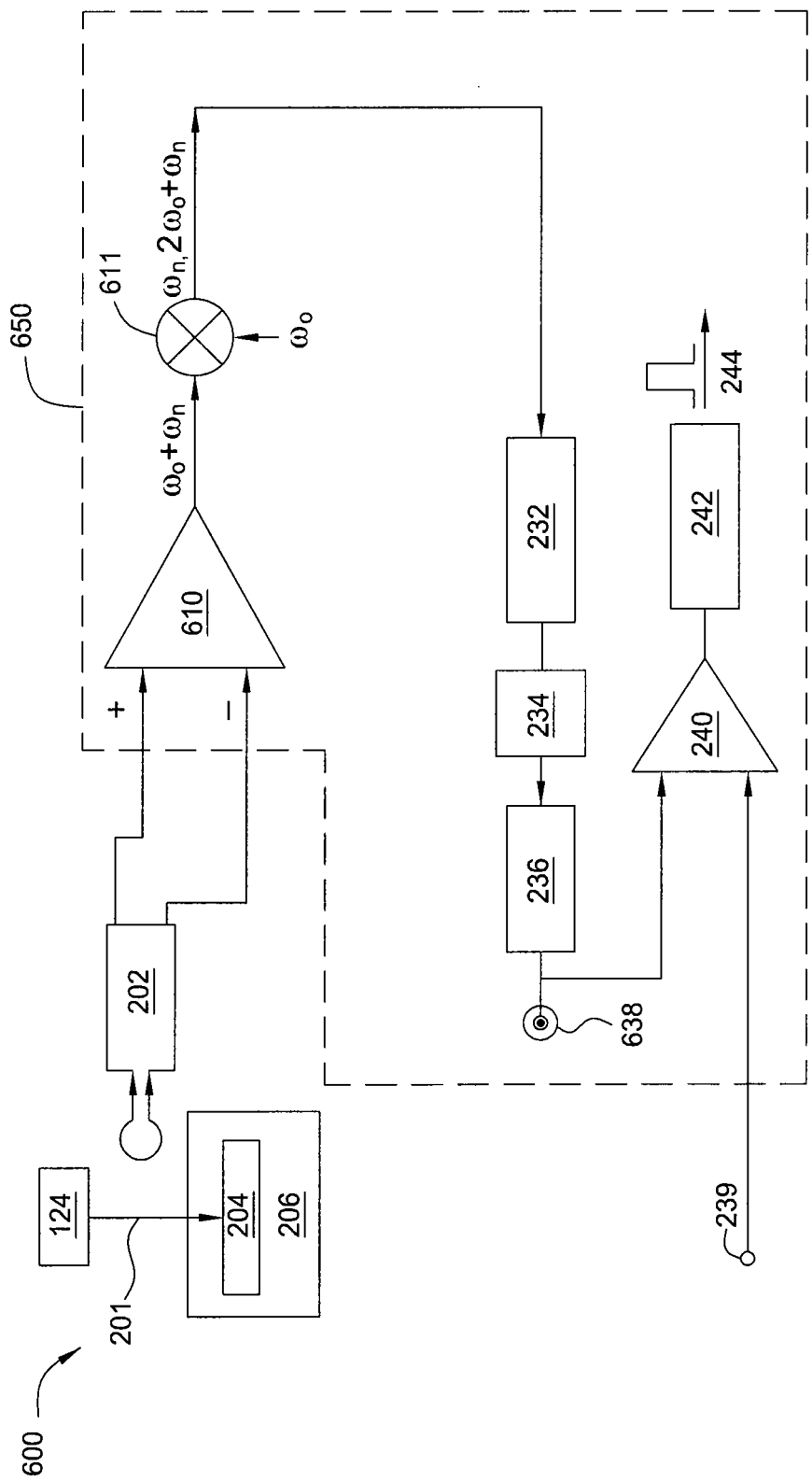
FIG. 6 is a schematic, block diagram of a current-based plasma excursion detection circuit according to another embodiment.

FIG. 6 is a schematic, block diagram of a current-based plasma excursion detection circuit 600 according to another embodiment. The detection circuit 600 includes the RF current probe 202 that is coupled to the RF power transmission line 201 just prior to connection of the RF power transmission line 201 to the powered electrode 204. The RF current probe 202 converts the detected RF current to an RF voltage. The RF voltage from the current probe 202 is then amplified by a differential RF amplifier 610 without any RF filtering between the RF current probe 202 and the differential RF amplifier 610. The resulting, unfiltered signal includes both the RF driving frequency (i.e., $\omega_o$), such as 13.56 MHz, and other frequencies (i.e., $\omega_n$), such as noise or plasma excursions. This unfiltered signal (i.e., $\omega_o+\omega_n$) is input into one input of a frequency mixer 611, and the RF driving frequency (i.e., $\omega_o$) is input into the other input of the frequency mixer 611.

The resulting output (i.e., $\omega_n$, $2\omega_o+\omega_n$) of the frequency mixer 611 is then passed through the analog band pass filter 232 having a pass band specifically designed to detect plasma excursion events, such as on a time scale of between about 10 μs and about 1 ms. For instance, the pass band of the band pass filter 232 may have a low cutoff at about 250 Hz and a high cutoff at about 50 kHz. The signal then passes through the high pass filter 234, which provides AC coupling and removes any DC offset. The signal is then passed through the amplifier 236 to provide an excursion output signal 638. The excursion output signal 638 is then fed into the comparator 240, wherein the value of the excursion output 638 is compared with the preset value 239. If the excursion output signal 638 exceeds the preset value within a specified time period, the comparator 240 passes a signal to the analog to digital converter 242 to generate the digital alarm signal 244 to flag the spike or plasma excursion. The alarm signal 244 can be fed back into the system controller 150, wherein an operator can be alerted and/or the processing system can be shut down.

Figure 7:
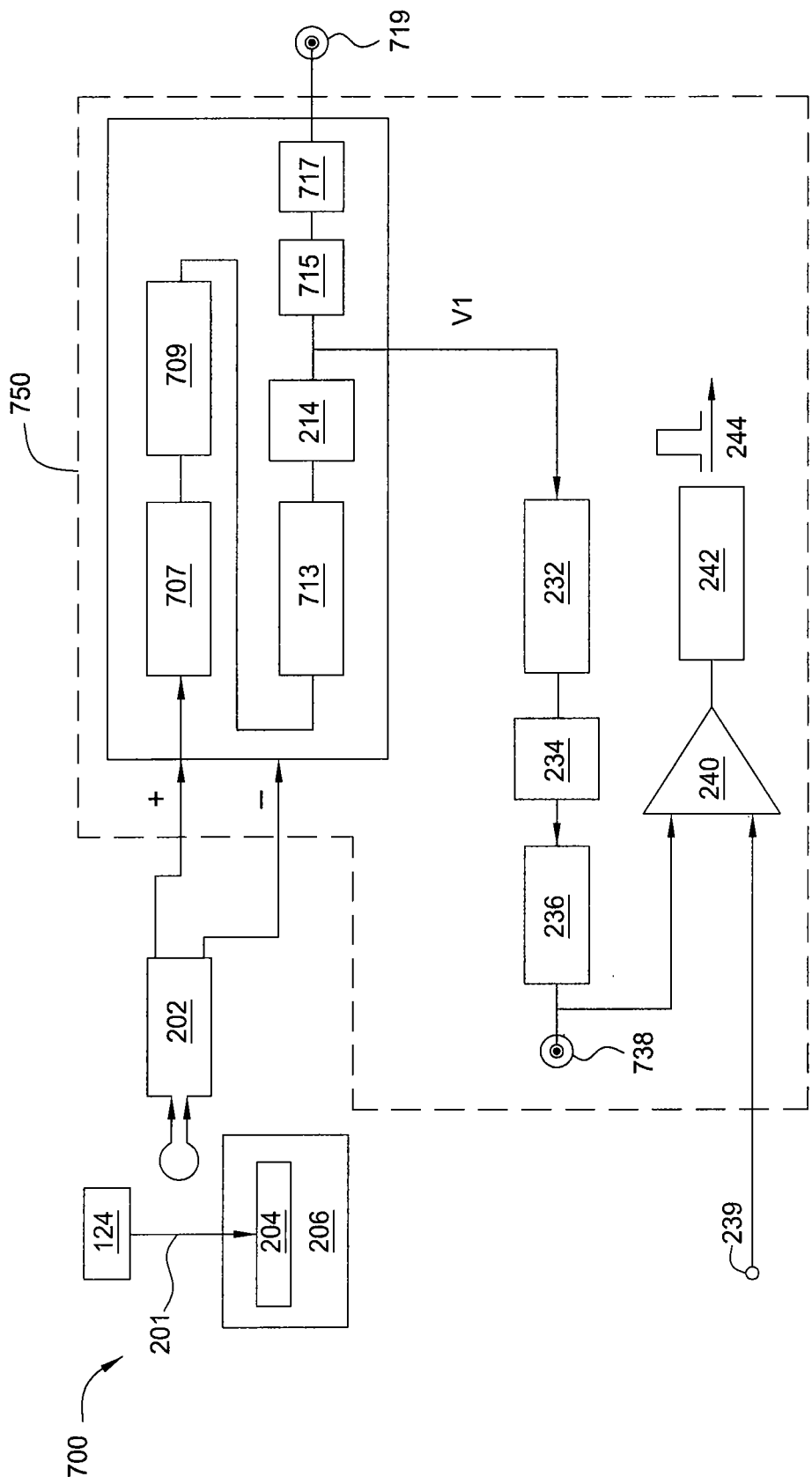
FIG. 7 is a schematic, block diagram of a current-based plasma excursion detection circuit according to another embodiment.

FIG. 7 is a schematic, block diagram of a current-based plasma excursion detection circuit 700 according to another embodiment. The detection circuit 700 includes the RF current probe 202 that is coupled to the RF power transmission line 201 just prior to connection of the RF power transmission line 201 to the powered electrode 204. The RF current probe 202 converts the detected RF current to an RF voltage which is fed into an attenuator 707 that receives and reduces the voltage signal from the RF current probe 202. The voltage signal is then passed through a band pass filter 709 that receives and filters the voltage signal from the attenuator 707. The band pass filter 709 may have a pass band of between about 10 MHz and about 16 MHz. The voltage signal is then passed through an RF RMS detector 713, such as the AD8363 TruPwr RMS power detector available from Analog Devices located in Norwood, Mass. The voltage signal may then be passed through one or more notch filters 214 to provide a filtered output voltage (V1). The filtered output voltage (V1) is then passed through a low pass filter 715 (e.g., blocks frequencies less than 100 Hz) and an amplifier 717 to provide an RMS voltage output 719 that represents the absolute magnitude of the RF current measured by the RF current probe 202.

The filtered output voltage (V1) is also passed through the band pass filter 232 having a pass band specifically designed to detect plasma excursion events, such as on a time scale of between about 10 μs and about 1 ms. For instance, the pass band of the band pass filter 232 may have a low cutoff at about 250 Hz and a high cutoff at about 50 kHz. The signal then passes through the high pass filter 234, which provides AC coupling and removes any DC offset. The signal is then passed through the amplifier 236 to provide an excursion output signal 738. The excursion output signal 738 is then fed into the comparator 240, wherein the value of the excursion output 738 is compared with the preset value 239. If the excursion output signal 738 exceeds the preset value within a specified time period, the comparator 240 passes a signal to the analog to digital converter 242 to generate the digital alarm signal 244 to flag the spike or plasma excursion. The alarm signal 244 can be fed back into the system controller 150, wherein an operator can be alerted and/or the processing system can be shut down. Therefore, the detection circuit 700 may be used for monitoring and controlling the plasma state as well as monitoring plasma stability and plasma excursion events.

Figure 8:
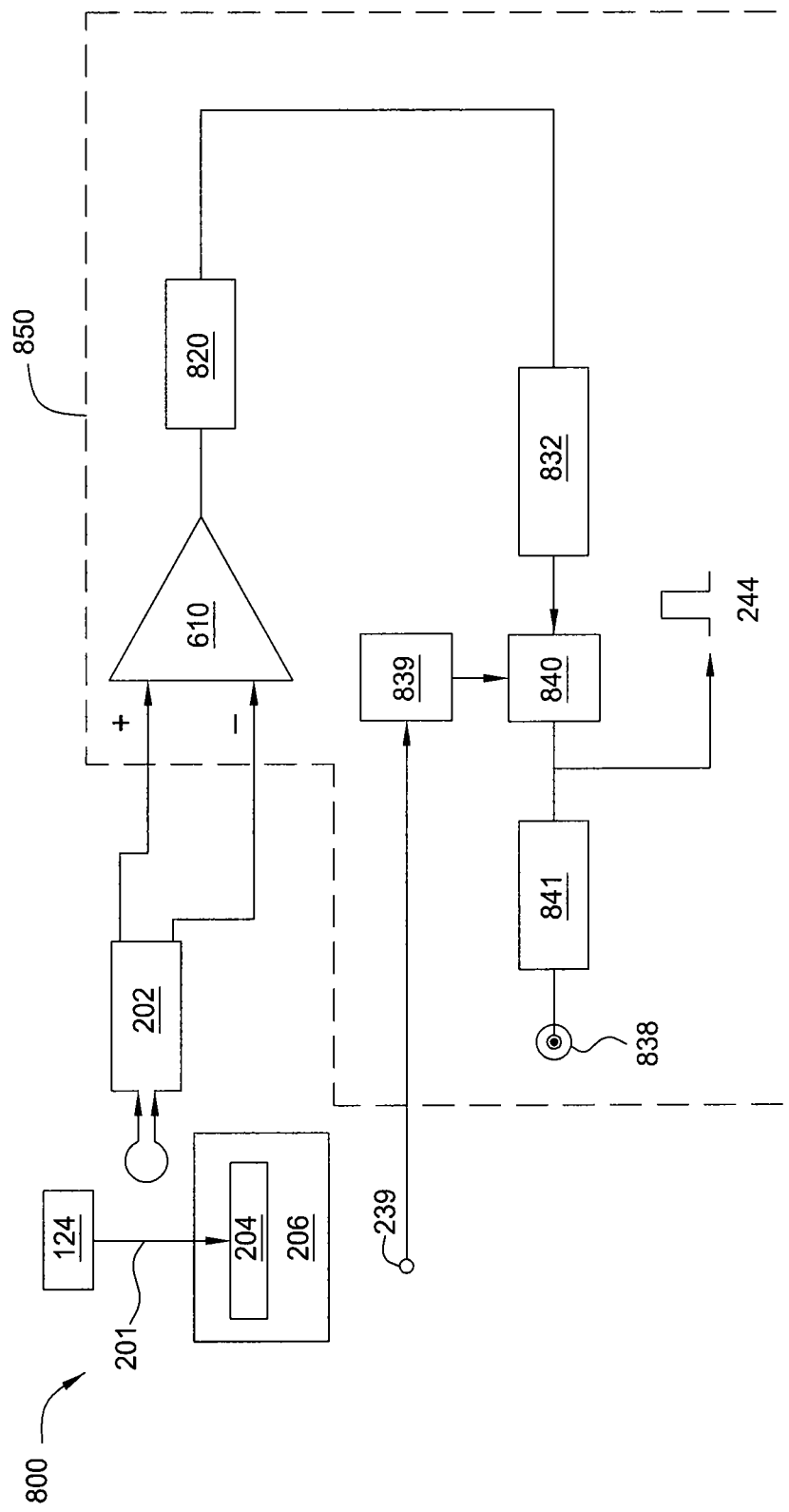
FIG. 8 is a schematic, block diagram of a current-based plasma excursion detection circuit according to another embodiment.

FIG. 8 is a schematic, block diagram of a current-based plasma excursion detection circuit 800 according to another embodiment. The detection circuit 800 includes the RF current probe 202 that is coupled to the RF power transmission line 201 just prior to connection of the RF power transmission line 201 to the powered electrode 204. The RF current probe 202 converts the detected RF current to an RF voltage. The RF voltage from the current probe 202 is then amplified by the differential RF amplifier 610 without any RF filtering between the RF current probe 202 and the differential RF amplifier 610. The RF voltage from the differential RF amplifier 610 is then converted to a digital signal via a fast analog to digital converter 820.

The digital RF signal is then passed through a band pass digital filter 832, such as a field programmable gate array (FPGA) based finite impulse response filter (FIR). In one embodiment, the band pass digital filter 832 is configured to pass frequencies between about 12 MHz and about 14 MHz. The filtered RF signal is then passed to a digital signal processor (DSP) 840, where the RF waveform is extracted and spectral analysis is performed to obtain the full spectra containing the driving RF frequency, noise, and any excursion signal, such as arcs or plasma oscillations. The filtered RF signal may be passed from the DSP 840 to a digital to analog converter 841 to produce an analog excursion output signal 838. The preset value 239 is converted to a digital signal in an analog to digital convertor 839 and compared with the filtered RF signal in the DSP 840. If the filtered RF signal exceeds the preset value 239 within a specified amount of time, the digital alarm signal 244 is produced to flag the spike or plasma excursion. The alarm signal 244 can be fed back into the system controller 150, where an operator can be alerted and/or the processing system can be shut down.

Thus, a system and method for the detection of plasma excursions, such as arcs, micro-arcs, or other plasma instability, during plasma processing by directly monitoring RF current just prior to reaching an RF power electrode of a plasma processing chamber is provided. The monitored RF current may be converted to an RF voltage and then passed through a succession of analog filters and amplifiers to provide a plasma excursion signal. The plasma excursion signal is compared to a preset value, and at points where the plasma excursion signal exceeds the preset value, an alarm signal is generated. The alarm signal is then fed back into a system controller so that an operator can be alerted and/or the processing system can be shut down. In one embodiment, the RF current amplified and converted to a digital signal for digital filtering and processing. In certain embodiments, multiple processing regions can be monitored by a single detection control unit.

While the foregoing is directed to embodiments of the present invention, other and further embodiments of the invention may be devised without departing from the basic scope thereof, and the scope thereof is determined by the claims that follow.

The invention claimed is:

1. A method for detecting plasma excursions in a plasma chamber, comprising:
   directly sensing a radio frequency (RF) current from an RF transmission line using a RF current probe at a position between an RF matching network and an RF powered electrode within the plasma chamber during plasma processing;
   generating a time-varying magnetic field around the RF transmission line when the RF current flowing through the RF transmission line;
   generating a time-varying electric field from the time-varying magnetic field;
   inducing the RF current by the time-varying electric field to flow through the RF current probe;
   converting the RF current to a voltage signal using the RF current probe which comprises a current transformer;
   filtering the voltage signal using a plurality of filters to obtain an output voltage signal;
   comparing the output voltage signal to a preset voltage value that represents a plasma excursion event; and
   generating an alarm signal if the output voltage signal exceeds the preset voltage value.

2. The method of claim 1, wherein the filtering the voltage signal comprises passing the voltage signal through a band pass filter.

3. The method of claim 2, wherein the band pass filter is configured to only pass frequencies between about 250 Hz and about 50 kHz.

4. The method of claim 1, further comprising passing the voltage signal through a frequency mixer prior to the filtering the voltage signal.

5. The method of claim 1, further comprising converting the voltage signal to a digital signal prior to the filtering the voltage signal.

6. The method of claim 5, wherein the comparing is performed by a digital signal processor.

7. The method of claim 1, further comprising measuring the absolute magnitude of the RF current sensed prior to the comparing.

8. The method of claim 1, wherein the filtering the voltage signal comprises serially passing the voltage signal through a low frequency pass filter and a high frequency pass filter.

9. The method of claim 8, wherein the low frequency pass filter is configured to pass frequencies below about 50 kHz and the high frequency pass filter is configured to pass frequencies above about 250 Hz.

10. The method of claim 1, further comprising continually collecting the output voltage signal with a data acquisition module.

11. The method of claim 1, further comprising collecting the output voltage signal with a data acquisition module only when an alarm signal is generated.

12. A system for detecting plasma excursions in a plasma chamber, comprising:
   one or more radio frequency (RF) current probes, each RF current probe positioned to sense an RF current from a transmission line at a position between an RF matching network and an RF electrode within a plasma chamber during plasma processing, wherein the RF current is configured to flow through the transmission line to generate a time-varying electric field, inducing the RF current to flow through the RF current probe, wherein each RF current probe comprises a current transformer configured to convert the RF current from the transmission line to a voltage signal; and
   a plasma excursion detection unit, comprising:
      one or more excursion detection modules, wherein each excursion detection module is configured to receive the voltage signal from one of the one or more RF current probes, wherein each excursion detection module comprises a plurality of filters arranged to filter the voltage signal to obtain an output voltage signal, and wherein each excursion module further comprises a comparator configured to compare the output voltage signal to a preset voltage signal and generate an alarm signal if the output voltage signal exceeds the preset voltage signal;
      one or more connection ports configured to receive the preset voltage signal from a host controller and configured to send the alarm signal to the host controller; and
      a data acquisition module configured to collect and transfer the output voltage signal from each of the one or more excursion detection modules.

13. The system of claim 12, wherein each of the excursion detection modules comprises a band pass filter configured to pass frequencies between about 250 Hz and about 50 kHz.

14. The system of claim 12, wherein the comparator is an analog voltage comparator.

15. The system of claim 12, wherein the comparator is a digital comparator.

16. The system of claim 12, wherein each excursion detection module further comprises a frequency mixer.

17. The system of claim 12, wherein each of the excursion detection modules comprises a low frequency pass filter and a high frequency pass filter.

18. The system of claim 17, wherein the low frequency pass filter is configured to pass frequencies less than about 50 kHz and the high frequency pass filter is configured to pass frequencies greater than about 250 Hz.

19. The system of claim 12, wherein the system comprises at least two RF current probes configured to sense RF current from separate transmission lines.

20. The system of claim 12, wherein the plurality of filters comprises a filter selected from the group consisting of an RF filter, a band pass filter, an analog band pass filter, a high frequency pass filter, a low frequency pass filter, a notch filter, a digital band pass filter, a digital signal processor (DSP), and combinations thereof.

21. The system of claim 12, wherein the data acquisition module is configured to collect and transfer the output voltage signal from each of the one or more excursion detection modules to a data logging and diagnostic system.

* * * * *